(12) United States Patent
Estakhri et al.

(10) Patent No.: US 7,721,017 B2
(45) Date of Patent: *May 18, 2010

(54) METHODS AND APPARATUS FOR IDENTIFYING OPERATING MODES FOR PERIPHERAL DEVICES

(75) Inventors: Petro Estakhri, Morgan Hill, CA (US); Mahmud Assar, Morgan Hill, CA (US)

(73) Assignee: Lexar Media, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/199,269

(22) Filed: Aug. 27, 2008

(65) Prior Publication Data

US 2008/0320175 A1 Dec. 25, 2008

Related U.S. Application Data

(60) Continuation of application No. 11/292,496, filed on Dec. 1, 2005, now Pat. No. 7,421,523, which is a continuation of application No. 10/647,084, filed on Aug. 21, 2003, now Pat. No. 7,111,085, which is a continuation of application No. 09/940,972, filed on Aug. 28, 2001, now Pat. No. 6,721,819, which is a division of application No. 09/234,430, filed on Jan. 20, 1999, now Pat. No. 6,385,667, which is a continuation-in-part of application No. 09/034,173, filed on Mar. 2, 1998, now Pat. No. 6,182,162.

(51) Int. Cl.
*G06F 3/00* (2006.01)
(52) U.S. Cl. .................. 710/15; 710/8; 710/11; 710/105
(58) Field of Classification Search ............... None
See application file for complete search history.

(56) References Cited

U.S. PATENT DOCUMENTS

| | | |
|---|---|---|
| 4,701,841 A | 10/1987 | Goodrich et al. |
| 5,329,491 A | 7/1994 | Brown et al. |
| 5,361,005 A | 11/1994 | Slattery et al. |
| 5,430,859 A | 7/1995 | Norman et al. |
| 5,495,422 A | 2/1996 | Olson |
| 5,524,362 A | 6/1996 | Quandt et al. |

(Continued)

FOREIGN PATENT DOCUMENTS

JP     63-155248     6/1988

(Continued)

OTHER PUBLICATIONS

CompactFlash bus pinout, http://pinouts.ru/Memory/CompactFlash_pinout.shtml, pp. 1-4, website accessed on Oct. 23, 2006.

(Continued)

*Primary Examiner*—Eron J Sorrell
(74) *Attorney, Agent, or Firm*—Leffert Jay & Polglaze, P.A.

(57) ABSTRACT

Apparatus and methods provide for configuring a peripheral device in response to applying defined sets of signals to input/output terminals of the peripheral device, sensing the signals at those input/output terminals after applying the defined sets of signals, and comparing the sensed signals with the defined sets of signals.

30 Claims, 4 Drawing Sheets

U.S. PATENT DOCUMENTS

| | | |
|---|---|---|
| 5,535,368 A | 7/1996 | Ho et al. |
| 5,579,502 A | 11/1996 | Konishi et al. |
| 5,594,874 A | 1/1997 | Narayanan et al. |
| 5,604,880 A | 2/1997 | Dipert |
| 5,630,170 A | 5/1997 | Koizumi et al. |
| 5,678,056 A | 10/1997 | Nakamura |
| 5,715,423 A | 2/1998 | Levy |
| 5,754,890 A | 5/1998 | Holmdahl et al. |
| 5,815,426 A | 9/1998 | Jigour et al. |
| 5,818,350 A | 10/1998 | Estakhri et al. |
| 5,818,781 A | 10/1998 | Estakhri et al. |
| 5,822,245 A | 10/1998 | Gupta et al. |
| 5,877,975 A | 3/1999 | Jigour et al. |
| 5,881,252 A | 3/1999 | Sahgal et al. |
| 5,889,959 A | 3/1999 | Whittaker et al. |
| 5,905,993 A | 5/1999 | Shinohara |
| 5,907,856 A | 5/1999 | Estakhri et al. |
| 5,909,596 A | 6/1999 | Mizuta |
| 5,920,197 A | 7/1999 | Price et al. |
| 5,920,731 A | 7/1999 | Pletl et al. |
| 5,922,055 A | 7/1999 | Shahar et al. |
| 5,928,347 A | 7/1999 | Jones |
| 5,928,370 A | 7/1999 | Asnaashari |
| 5,933,026 A | 8/1999 | Lersen et al. |
| 5,946,714 A | 8/1999 | Miyauchi |
| 6,012,103 A | 1/2000 | Sartore et al. |
| 6,018,265 A | 1/2000 | Keshtbod |
| 6,026,293 A | 2/2000 | Osborn |
| 6,038,400 A | 3/2000 | Bell et al. |
| 6,041,001 A | 3/2000 | Estakhri |
| 6,044,428 A | 3/2000 | Rayabhari |
| 6,062,480 A | 5/2000 | Evoy |
| 6,073,205 A | 6/2000 | Thomson |
| 6,084,483 A | 7/2000 | Keshtbod |
| 6,088,755 A | 7/2000 | Kobayashi et al. |
| 6,125,409 A | 9/2000 | Le Roux |
| 6,137,710 A | 10/2000 | Iwasaki et al. |
| 6,138,180 A | 10/2000 | Zegelin |
| 6,145,037 A | 11/2000 | Skakiara |
| 6,145,046 A | 11/2000 | Jones |
| 6,148,354 A | 11/2000 | Ban et al. |
| 6,154,788 A | 11/2000 | Robinson et al. |
| 6,157,559 A | 12/2000 | Yoo |
| 6,157,974 A | 12/2000 | Gasparik |
| 6,172,906 B1 | 1/2001 | Estakhri et al. |
| 6,173,314 B1 | 1/2001 | Kurashima et al. |
| 6,175,770 B1 | 1/2001 | Bladow |
| 6,182,162 B1 | 1/2001 | Estakhri et al. |
| 6,199,122 B1 | 3/2001 | Kobayashi |
| 6,266,720 B1 | 7/2001 | Kakinoki |
| 6,314,480 B1 | 11/2001 | Nemazie et al. |
| 6,339,831 B1 | 1/2002 | Sugawara et al. |
| 6,385,667 B1 | 5/2002 | Estakhri et al. |
| 6,385,677 B1 | 5/2002 | Yao |
| 6,404,246 B1 | 6/2002 | Estakhri et al. |
| 6,418,501 B1 | 7/2002 | Gama et al. |
| 6,434,648 B1 | 8/2002 | Assour et al. |
| 6,434,660 B1 | 8/2002 | Lambert et al. |
| 6,438,638 B1 | 8/2002 | Jones et al. |
| 6,442,625 B1 | 8/2002 | Robinson et al. |
| 6,446,177 B1 | 9/2002 | Tanaka et al. |
| 6,457,071 B1 | 9/2002 | Thorland et al. |
| 6,460,094 B1 | 10/2002 | Hanson et al. |
| 6,484,216 B1 | 11/2002 | Zegelin |
| 6,546,482 B1 | 4/2003 | Magro et al. |
| 6,567,875 B1 | 5/2003 | Williams et al. |
| 6,625,790 B1 | 9/2003 | Casebolt et al. |
| 6,628,552 B1 | 9/2003 | Larsen et al. |
| 6,633,933 B1 | 10/2003 | Smith et al. |
| 6,658,497 B1 | 12/2003 | Kawasaki et al. |
| 6,658,516 B2 | 12/2003 | Yao |
| 6,687,814 B1 | 2/2004 | Duppong |
| 6,697,886 B1 | 2/2004 | Muraki et al. |
| 2002/0147882 A1 | 10/2002 | Pua et al. |

FOREIGN PATENT DOCUMENTS

| | | |
|---|---|---|
| JP | 64-076316 | 3/1989 |
| JP | 09-016732 | 1/1997 |

OTHER PUBLICATIONS

Universal Serial Bus, Wikipedia, http://en.wikipedia.org/wiki/usb, pp. 1-21, website accessed on Oct. 23, 2006.

"Compact Flash Specification", Compact Flash Association, Revision 1.0, 1996. pp. 1-76.

METHODS AND APPARATUS FOR IDENTIFYING OPERATING MODES FOR PERIPHERAL DEVICES

RELATED APPLICATIONS

This Patent Application is a continuation of U.S. patent application Ser. No. 11/292,496, filed Dec. 1, 2005, entitled "Flash Memory Card With Enhanced Operating Mode Detection and User-Friendly Interfacing System," now issued as U.S. Pat. No. 7,421,523, which is a continuation of U.S. patent application Ser. No. 10/647,084, filed Aug. 21, 2003, entitled "Flash Memory Card With Enhanced Operating Mode Detection and User-Friendly Interfacing System," now issued as U.S. Pat. No. 7,111,085, which is a continuation of U.S. patent application Ser. No. 09/940,972, filed Aug. 28, 2001, entitled "Flash Memory Card With Enhanced Operating Mode Detection and User-Friendly Interfacing System," now issued as U.S. Pat. No. 6,721,819, which is a divisional of U.S. patent application Ser. No. 09/234,430, filed Jan. 20, 1999, entitled "System For Configuring a Flash Memory Card With Enhanced Operating Mode Detection and User-Friendly Interfacing System," now issued as U.S. Pat. No. 6,385,667, which is a continuation-in-part of U.S. patent application Ser. No. 09/034,173, filed Mar. 2, 1998, entitled "Improved Compact Flash Memory Card and Interface," now issued as U.S. Pat. No. 6,182,162, all of which are incorporated by reference herein in their entirety.

TECHNICAL FIELD

This disclosure relates to the field of apparatus facilitating connectivity between a host, e.g., a computer system, and a peripheral device, e.g., a memory device. More particularly, this disclosure relates to the field of flash memory cards capable of identifying the operating mode of an interface apparatus or host computer system's peripheral port to which the flash memory cards are coupled and of automatically configuring themselves to operate in the identified operating mode.

BACKGROUND

The continual penetration of computer systems into additional markets has been fueled by the emphasis on cost effective user-friendly adaptations for the computer system and on minimizing the amount of resources the user expends configuring the computer system rather than productively utilizing the computer system. Concomitant with the explosion in the popularity of computer systems has seen the proliferation of available externally attachable/detachable peripheral devices for use with the computer system to meet the application demands of the user. One such peripheral is the flash memory card.

A flash memory card is a nonvolatile memory device with a compact housing that does not require a power source in order to retain its memory contents. A typical flash memory card stores charge on a floating gate to represent a first logic state of the binary state system, while the lack of stored charge represents a second logic state of the binary state system. Additionally, the typical flash memory card is capable of performing a write operation, a read operation, and an erase operation.

Flash memory cards can provide "plug and play" capability, low power consumption, portability, and high density storage. Flash memory cards are well suited for digital applications such as digital camera storage, digital audio applications, and wherever rewritable, digital data storage in a portable housing is needed.

The input/output terminal of the flash memory card is configured to observe one of the prevailing industry standards. This standard requires the input/output terminal to be a fifty pin connector. The flash memory card with its fifty pin connector is designed to fit within either a fifty pin flash socket or, with the addition of a passive adapter, a sixty-eight pin PCMCIA socket. However, most host computer systems do not have either the fifty pin flash socket or the sixty-eight pin PCMCIA socket. If a user wishes to utilize the flash memory card with the host computer system, the user must purchase an expensive PCMCIA socket to connect with the host computer system.

Another deficiency in the current flash memory card market is the inability of the flash memory card to be conveniently configured for operating in the universal serial bus (USB) mode, the PCMCIA mode, the ATA IDE mode, or any other protocol for coupling peripheral devices to host computer systems and accessing the peripheral devices. There is a need for a flash memory card that automatically detects and configures itself to the operating mode being utilized by the interface apparatus or host computer system's peripheral port to which the flash memory card is coupled.

Applicant previously proposed a flash memory card and interfacing system to address the current unavailability of automatically configurable flash memory cards. That flash memory card and interfacing system is disclosed in U.S. patent application Ser. No. 09/034,173, filed Mar. 2, 1998, entitled "Improved Compact Flash Memory Card and Interface," now issued as U.S. Pat. No. 6,182,162, which is incorporated herein by reference.

Applicant's previous flash memory card and interfacing system is shown in FIG. 1A. The interfacing system 10 includes a flash memory card interface device 100 and a flash memory card 90 with a fifty pin connector. The flash memory card interface device 100 employs the universal serial bus architecture. The flash memory card interface device 100 includes the following components: a housing 20, a card slot 30, a cable 40, a cable connector 45, and a plug 50. For one embodiment, the cable 40 is a standard universal serial bus cable. The plug 50 is configured to easily couple with a universal serial bus port on a host computer system.

FIG. 1B illustrates a bottom cutaway view of the housing 20 in the flash memory card interface device 100. FIG. 1C illustrates a perspective cutaways view of the flash memory card interface device 100. A card receiver housing 130 is attached to the bottom plate 110. Additionally, a plurality of contact pins 160 are coupled to the card receiver housing 130, e.g., fifty contact pins. The card receiver housing 130 is configured to couple and hold the flash memory card 90 as the flash memory card 90 is inserted through the slot opening 30 in the housing 20 as shown in FIG. 1A. Further, the plurality of contact pins 160 are configured to electrically couple with the corresponding pins (not shown) on the flash memory card 90.

In operation, one end of flash memory card interface device 100 is coupled to a host computer system (not shown) via the plug 50 and the other end of the flash memory card interface device 100 is coupled to the flash memory card 90 via the card receiver housing 130, a fifty pin connection.

Applicant's previous flash memory card 90 detected the operating mode of the interface device 100 to which the previous flash memory card was coupled and configured itself to the appropriate operating mode by using an internal controller and a sensing means coupled to the internal controller.

FIG. 2 illustrates a flowchart diagram which represents the procedure the internal controller of the previous flash memory card 90 could follow in detecting the operating mode of the interface device 100 to which the previous flash memory card 90 was coupled. The fundamental mechanism utilized by the internal controller for detecting the operating mode consists solely of sensing signals at the fifty pin connector of the previous flash memory card 90. At the fifty pin connector, the internal controller does not alter or add signals, but simply senses the signals.

The operating mode detection sequence begins with the previous flash memory card 90 being coupled to the flash memory card interface device 100, which is coupled to the host computer system, then proceeding to the BLOCK 200 routine of powering up the previous flash memory card 90. After the power up sequence in BLOCK 200, the signal at the HOE_pin terminal of the previous flash memory card 90 is sensed in BLOCK 210. If the signal at the HOE_pin terminal is a logic HIGH, then proceeding to BLOCK 220 the internal controller configures the previous flash memory card 90 into the PCMCIA mode. However, if the signal at the HOE_pin terminal is logic LOW, then proceeding to BLOCK 230 the signal at the HOSTRESET_pin terminal is sensed. If the signal at the HOSTRESET_pin terminal is logic LOW, then the operating mode detection sequence returns to BLOCK 230 and senses the signal at the HOSTRESET_pin terminal again. If the signal at the HOSTRESET_pin terminal remains logic LOW, then the operating mode detection sequence continues to loop back to BLOCK 230 until the HOSTRESET_pin terminal switches to logic HIGH. If the signal at the HOSTRESET_pin terminal is logic HIGH, then proceeding to BLOCK 240 the signals at pin terminals IOW_, IOR_, HCE1.sub.-, and HCE2_ are sensed. If all of these signals are logic LOW, then proceeding to BLOCK 250 the internal controller configures the previous flash memory card 90 into the universal serial bus mode. If any of these signals are logic HIGH, then proceeding to BLOCK 260 the internal controller configures the previous flash memory card 90 into the ATA IDE mode.

Unfortunately, since the previous flash memory card 90 relies solely on sensing particular signals at particular pin terminals, the previous flash memory card 90 is limited as to the number of different operating modes it is capable of detecting. In addition, reliance on sensing a few pin terminals is susceptible to detecting an incorrect operating mode because a single missensed signal could cause the previous flash memory card 90 to be configured to the incorrect operating mode.

What is needed is a flash memory card capable of detecting a large number of different operating modes. What is further needed is a flash memory card capable of accurately and automatically detecting the operating mode of the interface device or host computer system's peripheral port to which the flash memory card is coupled and of configuring itself to the detected operating mode. What is further needed is an interfacing system which simplifies both the attachment to host computer systems and configuration of flash memory cards from the end-user perspective.

DETAILED DESCRIPTION

Figures 1A, 1B, 1C:
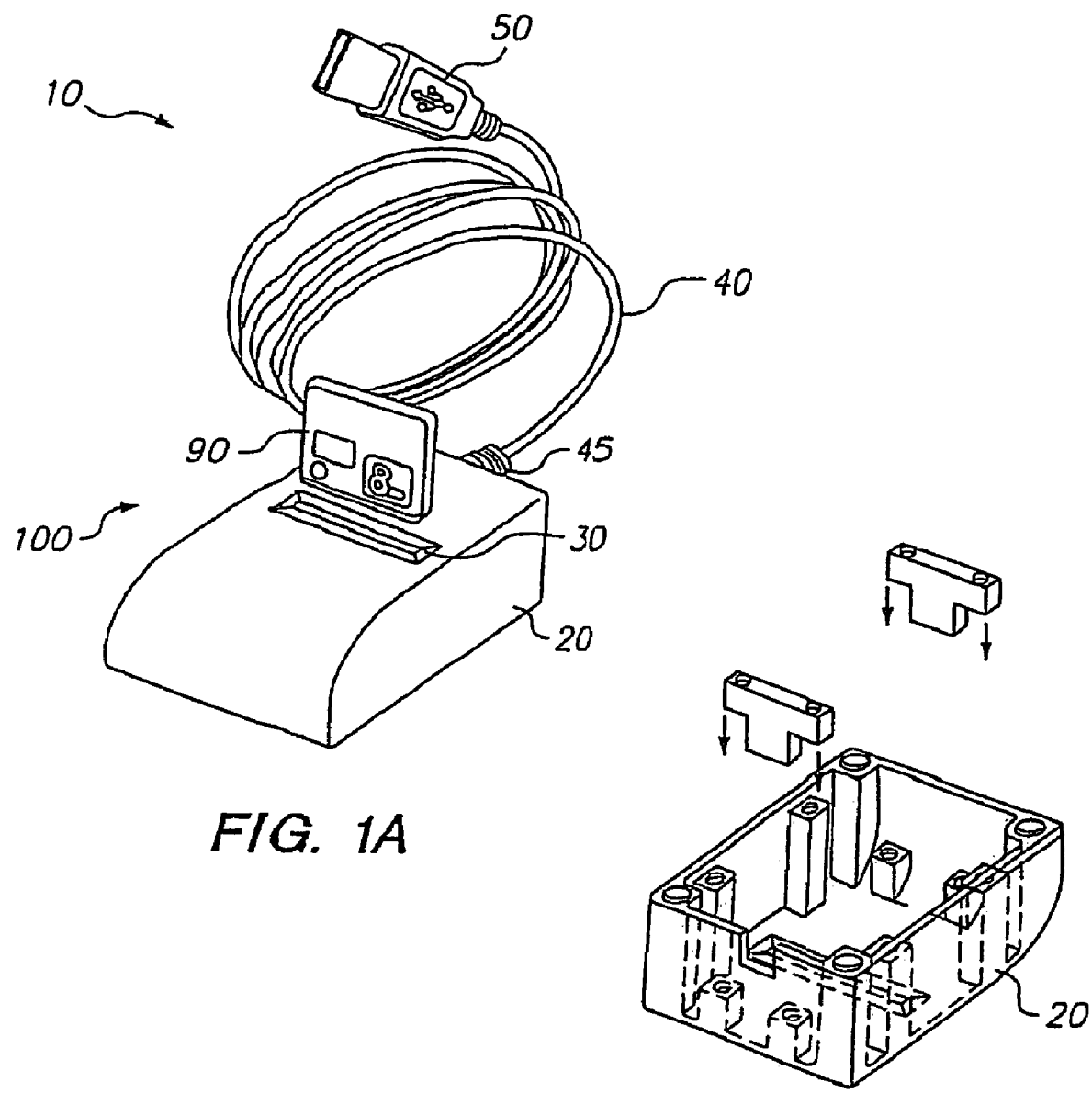
FIG. 1A illustrates a perspective view of an embodiment of the disclosure.
FIG. 1B illustrates a bottom cutaway view of an embodiment of the disclosure.
FIG. 1C illustrates a perspective inside view of an embodiment of the disclosure.
Figure 2:
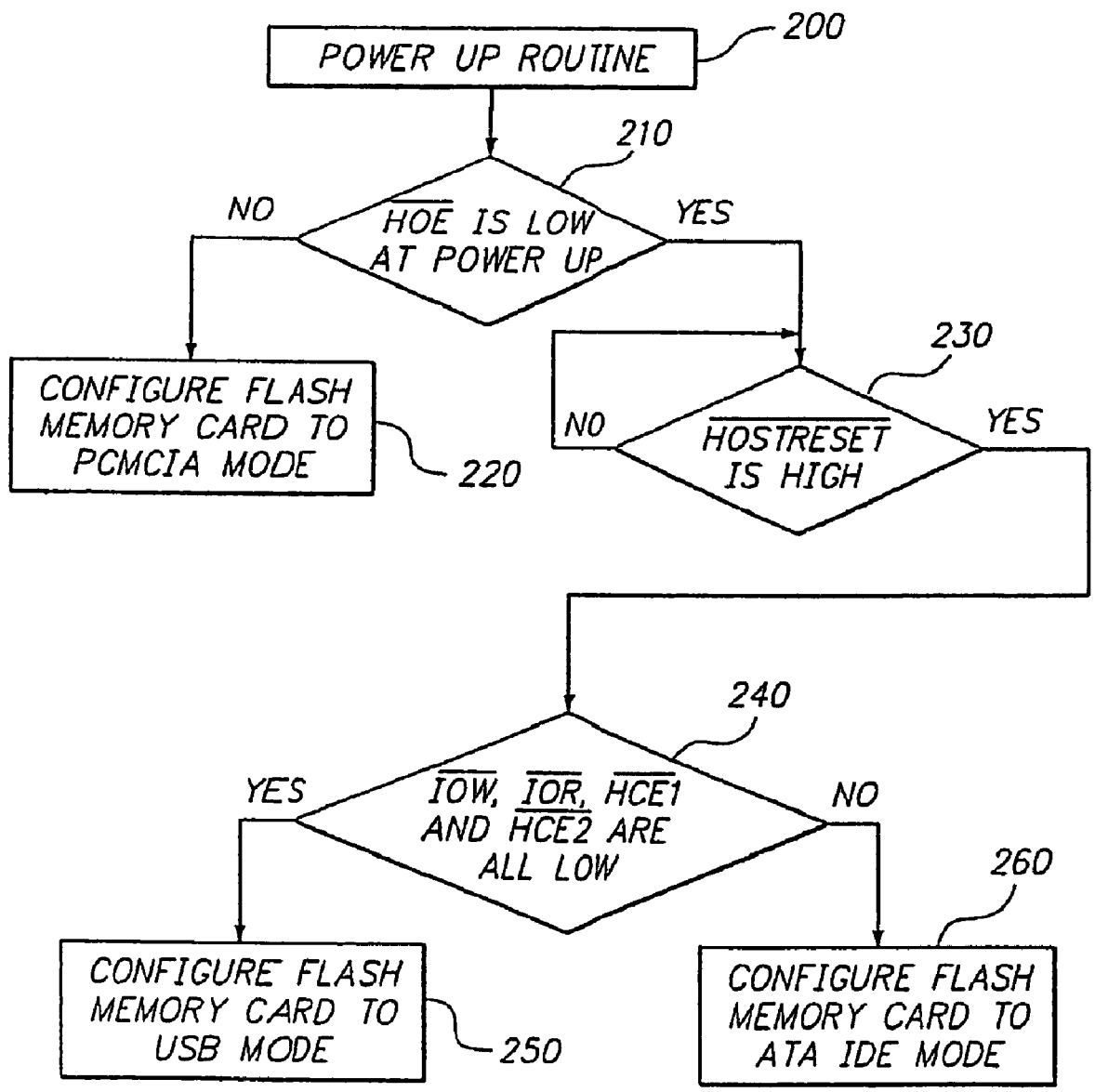
FIG. 2 shows a flowchart diagram of an embodiment of the disclosure.

The present disclosure includes a flash memory card interfacing system for connecting in a selected operating mode a flash memory card to a host computer system. The flash memory card interfacing system represents a low cost user friendly adaptation for coupling and configuring flash memory cards as peripheral devices to host computer systems while simplifying the end user's involvement in this coupling and configuration process. In addition to simplifying the connection of flash memory cards to host computer systems, the flash memory card interfacing system's features include: significantly expanded operating mode detection capability within the flash memory card and marked reduction in the incorrect detection of operating modes. The flash memory card interfacing system has an interface device and a flash memory card. The flash memory card has a fifty pin connecting terminal for coupling to the computer system through the interface device. In addition, the flash memory card comprises: a flash memory module, a controller, an encoding circuitry, and a sensing circuitry.

The flash memory card is functionally ready to conduct data storage operations for the host computer system within a short period of being coupled to the computer system through the interface device. Attaining this quick operational readiness is achieved by having the flash memory card execute, immediately after initial communication with the interface device, a sequential procedure for identifying the selected operating mode of the interface device. After identifying the selected operating mode, the flash memory card automatically configures itself to the selected operating mode without receiving configuration data from an external source. Interface devices employing operating modes such as the universal serial bus mode, the PCMCIA mode, and the ATA IDE mode can functionally operate with the flash memory card. In addition, interface devices utilizing other protocols for attaching and accessing peripheral devices can also functionally operate with the flash memory card without much difficulty.

The expanded operating mode detection capability of the flash memory card, once coupled in a selected operating mode to the host computer system through the interface device, is accomplished by dedicating a plurality of signals originating from the host computer system to an encoding procedure formulated to identify an increased number of operating modes. By encoding the plurality of signals with a predetermined code and then sensing the applied predetermined code, the flash memory card can identify the selected operating mode by observing changes between the predetermined code applied to the plurality of signals and the code actually sensed from the plurality of signals. Since each operating mode is assigned a unique code, discrepancy between the predetermined code and the sensed code indicates the selected operating mode differs from the operating mode assigned to the predetermined code applied to the plurality of signals. The flash memory card applies a different predetermined code until the selected operating code is identified.

The flash memory card interfacing system of the present disclosure simplifies from the end user's perspective the process of coupling and configuring in a selected operating mode a flash memory card to a host computer system as a peripheral device. This process of coupling and configuring the flash memory card is reduced to steps easily understandable to both the novice end user and the technically proficient end user. Initially, a first end of an interface device is coupled to the host computer system, while the flash memory card is coupled to a second end of the interface device. The flash memory card is then powered by the host computer system or a different power source. Finally, the flash memory card automatically detects the selected operating mode of the interface device and configures itself to function in the selected operating mode. The identification of the selected operating mode involves sequentially processing signals originating from the host computer system until the selected operating mode is identified. From the end user's perspective, the configuration of the flash memory card proceeds without the end user sending configuration instructions to the flash memory card or manipulating computer hardware settings.

Figure 3:
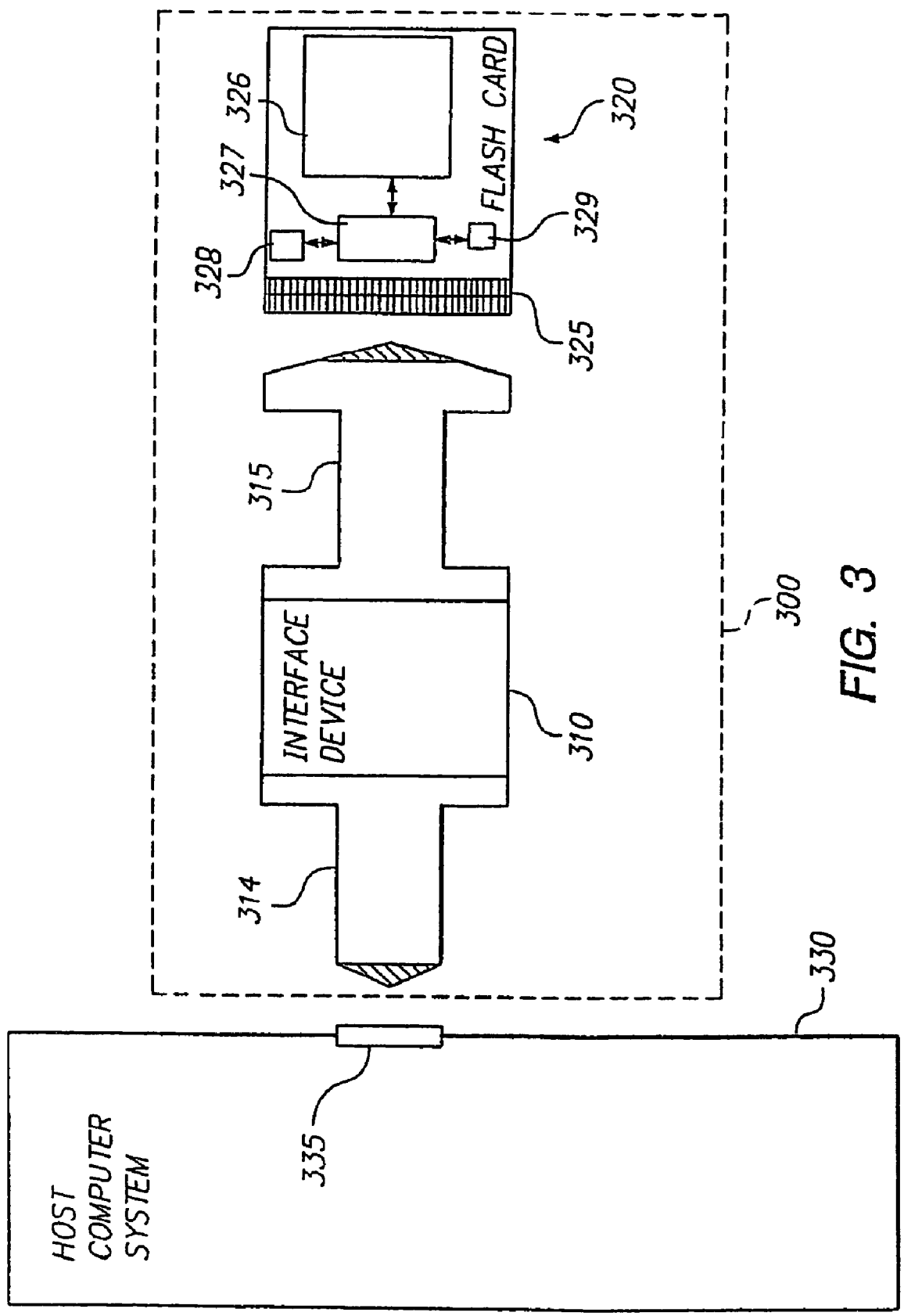
FIG. 3 illustrates a schematic block diagram of an embodiment of the disclosure coupled to a host computer system.

A schematic block diagram of an embodiment of the disclosure coupled to a host computer system is illustrated in FIG. 3. This flash memory card interfacing system 300 includes an interface device 310 and a flash memory card 320.

For one embodiment, the interface device 310 includes a first end 314 and a second end 315. The first end 314 is configured for coupling to the host computer system 330. The second end 315 is configured for coupling to the flash memory card 320. In addition, for more efficient communication between the flash memory card 320 and the host computer system 330, the second end 315 is configured to support a fifty pin connection. The first end 314 and the second end 315 support communication in a selected operating mode which is also supported by the host computer system's peripheral port 335. Each selected operating mode is associated with a unique protocol for coupling and accessing peripheral devices. The interface device 310 can be implemented in a variety of protocols that are known to those skilled in the art. The protocols: universal serial bus, PCMCIA, and ATA IDE, are only a few examples of the available protocols for attaching and accessing peripheral devices to the host computer system 330. To maximize the low cost user-friendliness feature of the flash memory card interfacing system 300, the interface device 310 of one embodiment employs the universal serial bus protocol. The universal serial bus protocol provides a fast bi-directional isochronous transfer of data between external peripheral devices and the host computer system 330 at very low cost.

In practice, the interface device 310 of one embodiment couples to the host computer system 330 via the first end 314, while the second end 315 is coupled to the flash memory card 320. Eliminating and/or combining certain elements shown in the interface device 310 would be apparent to a person skilled in the art and would not depart from the scope of the present disclosure.

The flash memory card of one embodiment includes a flash memory module 326, a controller 327, an encoding circuitry 328, and a sensing circuitry 329. The flash memory module 326 is capable of executing a write operation, a read operation, and an erase operation. The controller 327 is electrically coupled to the flash memory module 326. In addition, the controller 327 configures the flash memory card 320 to the selected operating mode of the interface device 310. The encoding circuitry 328 and the sensing circuitry 329 are electrically coupled to the controller 327. Both the encoding circuitry 328 and the sensing circuitry 329 perform the task of identifying the selected operating mode of the interface device 310. This identification circuitry can be physically formed on the flash memory card 320 or in an adapter module coupled between the flash memory card 320 and the second end 315 of the interface device 310.

The flash memory card 320 of one embodiment includes a fifty pin connector end 325 as illustrated in FIG. 3. The fifty pins serve as input/output and control terminals for the flash memory card 320 and carry signals. However, the extent that a pin is utilized in communicating with the host computer system 330 depends on the selected operating mode to which the flash memory card 320 is configured. For example, in the ATA IDE operating mode, the pin terminals labelled HA0, HA1, and HA2 are actively transmitting signals from the host computer system 320, but the pin terminals labelled HA3, HA4, HA5, HA6, HA7, HA8, HA9, and HA10 are inactive. For identifying the selected operating mode, the flash memory card 320 implements a sequential procedure that utilizes the signals at inactive pins for detection of the selected operating mode. This sequential procedure allows the flash memory card 320 to accurately detect a large variety of operating modes and gives the flash memory card 320 the versatility to detect operating modes yet to be developed.

Figure 4:
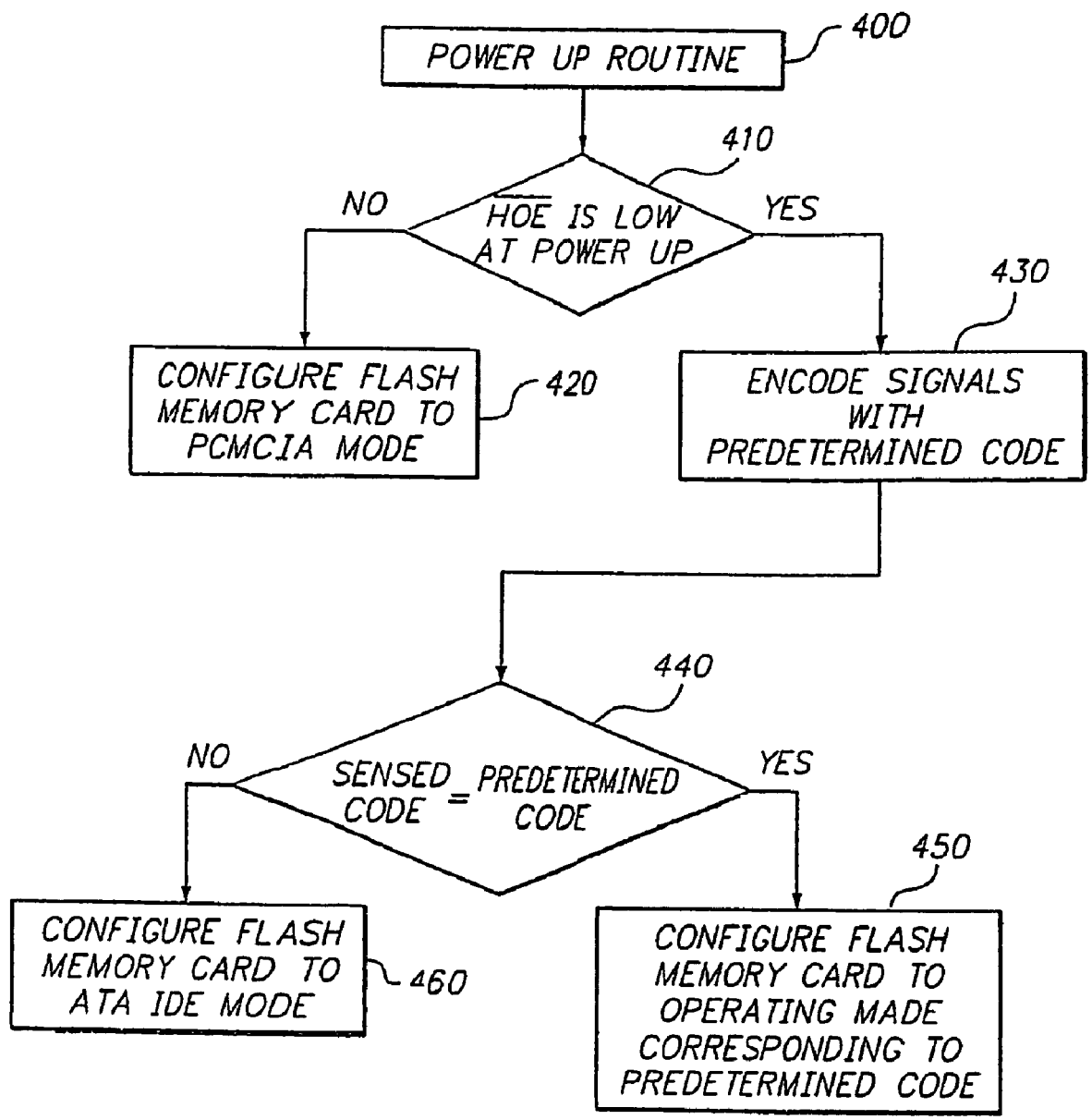
FIG. 4 shows a flowchart diagram of an embodiment of the disclosure.

FIG. 4 illustrates a flowchart diagram which represents a sample sequence of steps the controller 327 of the flash memory card 320 executes in determining the selected operating mode of the interface device 310. The operating mode detection sequence begins with the flash memory card 320 being coupled to the interface device 310, which is coupled to the host computer system 330, then proceeding to the BLOCK 400 routine of powering up the flash memory card 320. After the power up sequence in BLOCK 400, the signal at the HOE_pin terminal of the flash memory card 320 is sensed in BLOCK 410. The signal at the HOE_pin terminal originates from the host computer system 330. If the signal at the HOE_pin terminal is a logic HIGH, then proceeding to BLOCK 420 the controller 327 configures the flash memory card 320 into the PCMCIA mode. However, if the signal at the HOE_pin terminal is a logic LOW, then proceeding to BLOCK 430 preencoded signals at pin terminals labelled HA3, HA4, HA5, HA6, HA7, HA8, HA9, and HA10 are encoded with a predetermined code which uniquely identifies all operating mode. The preencoded signals are encoded on the flash memory card 320. This encoding process transforms the preencoded signals into encoded signals. Continuing to BLOCK 440, the encoded signals are sensed. If the encoded signals retain the predetermined code, proceeding to BLOCK 450 the controller 327 configures the flash memory card 320 to the operating mode corresponding to the predetermined code. However, if the encoded signals do not retain the predetermined code, then the operating mode detection sequence proceeds to BLOCK 460 where the controller 327 configures the flash memory card 320 into the ATA EDE mode.

These specifically named operating modes are merely exemplary. The flash memory card 320 can be configured to automatically detect and operate in additional operating modes.

To facilitate the detection of the selected operating mode, the controller 327 of one embodiment configures the flash memory card 320 into a preliminary operating mode before proceeding to the encoding sequence of BLOCK 430. For one embodiment, the preliminary operating mode is the ATA IDE mode. Configuring the flash memory card 320 into the preliminary operating mode assists the encoding process, but does not affect the operating mode detection procedure.

The predetermined code that uniquely identifies an operating mode is chosen such that to minimize the detection of an incorrect operating mode. Each predetermined code is different from every other predetermined code. The length of the predetermined code may correspond to the number of signals that are scheduled for encoding. The controller 327 of the flash memory card 320 may be programmed with the finite set of predetermined codes. Alternatively, the finite set of predetermined codes can be programmed in an adapter module coupled between the flash memory card 320 and the second end 315 of the interface device 310.

Although the example embodiment employs signals at pin terminals labelled HA3, HA4, HA5, JHA6, HA7, HA8, HA9, and HA10 of the ATA IDE operating mode for encoding purposes, employing different signals at different pin terminals of a variety of other operating modes would not depart from the spirit and scope of the present disclosure. Additionally, reducing or enlarging the number of signals utilized for detecting the operating mode would not depart from the spirit and scope of the present disclosure.

Embodiments of the present disclosure have been described in terms of specific embodiments incorporating details to facilitate the understanding of the principles of their construction and operation. Such reference herein to specific embodiments and details thereof is not intended to limit the scope of the claims appended hereto. It will be apparent to those skilled in the art that modifications may be made in the embodiments chosen for illustration, and this application is intended to cover any adaptations or variations of the disclosure.

Specifically, it will be apparent to one of ordinary skill in the art that the device of the present disclosure could be implemented in several different ways and the apparatus disclosed above is only illustrative of an embodiment of the disclosure and is in no way a limitation. For instance, the flash memory card interfacing system could be implemented with a variety of peripheral devices other than the flash memory card.

What is claimed is:

1. A peripheral device, comprising:
a controller;
identification circuitry electrically coupled to the controller; and
input/output terminals for communication with a host to the peripheral device;
wherein the controller is configured to selectively apply a defined set of signals to a plurality of input/output terminals of the peripheral device using the identification circuitry and to sense signals at the plurality of input/output terminals using the identification circuitry after applying the defined set of signals; and
wherein the controller is configured to compare the sensed signals to the defined set of signals and to configure the peripheral device to operate in an operating mode corresponding to the defined set of signals if the sensed signals match the defined set of signals.

2. The peripheral device of claim 1, wherein the peripheral device is a nonvolatile memory device.

3. The peripheral device of claim 2, wherein the nonvolatile memory device is a flash memory card.

4. The peripheral device of claim 1, wherein the controller is further configured, upon power-up of the peripheral device, to check a signal of an input/output terminal of the peripheral device before applying a defined set of signals to the plurality of input/output terminals; to configure the peripheral device to operate in a defined operating mode if the signal has a first value; and to proceed to applying a defined set of signals to the plurality of input/output terminals if the signal has a second value.

5. The peripheral device of claim 1, wherein the controller is further configured to configure the peripheral device to operate in a defined operating mode different from the operating mode corresponding to the defined set of signals if there is a discrepancy between the sensed signals and the defined set of signals.

6. The peripheral device of claim 1, wherein the controller is further configured to selectively apply a different defined set of signals to the plurality of input/output terminals of the peripheral device using the identification circuitry and to sense signals at the plurality of input/output terminals using the identification circuitry after applying the different defined set of signals, to compare the sensed signals to the different defined set of signals, and to configure the peripheral device to operate in an operating mode corresponding to the different defined set of signals if the sensed signals match the different defined set of signals.

7. The peripheral device of claim 1, wherein the controller is further configured to iteratively compare sensed signals to one of a finite number of defined sets of signals, to configure the peripheral device to operate in an operating mode corresponding to a particular defined set of signals if the sensed signals match that particular defined set of signals, to apply a next defined set of signals if the sensed signals do not match that particular defined set of signals, and to configure the peripheral device to operate in an operating mode not corresponding to any of the finite number of defined sets of signals if the sensed signals do not match that particular defined set of signals and that particular defined set of signals is a last defined set of signals of the finite number of defined sets of signals.

8. The peripheral device of claim 7, wherein the controller contains the finite number of defined sets of signals.

9. The peripheral device of claim 1, wherein the controller is further configured to selectively apply a defined set of signals in response to an initial communication with the host.

10. The peripheral device of claim 1, wherein the controller is further configured to selectively apply the defined set of signals to those input/output terminals of the peripheral device corresponding to input/output terminals that are inactive for the operating mode corresponding to the defined set of signals.

11. The peripheral device of claim 1, wherein the controller is further configured to configure the peripheral device to operate in a preliminary operating mode before applying any defined set of signals to the plurality of input/output terminals of the peripheral device.

12. A peripheral device, comprising:
a controller;
identification circuitry electrically coupled to the controller; and
input/output terminals for communication with a host to the peripheral device;
wherein the controller is configured to selectively apply a particular one of a defined set of signals of a finite number of defined sets of signals to a plurality of input/output terminals of the peripheral device using the identification circuitry and to sense signals at the plurality of input/output terminals using the identification circuitry after applying that particular defined set of signals; and
wherein the controller is configured to compare the sensed signals to that particular defined set of signals, to configure the peripheral device to operate in an operating mode corresponding to that particular defined set of signals if the sensed signals match that particular defined set of signals, to repeat selectively applying and comparing signals for a next defined set of signals if there is a discrepancy between the sensed signals and that particular defined set of signals and if that particular defined set of signals is not a last defined set of signals of the finite number of the defined sets of signals, and to configure the peripheral device to operate in an operating mode not corresponding to any of the finite number of defined sets of signals if there is a discrepancy between the sensed signals and that particular defined set of signals and if that particular defined set of signals is the last defined set of signals of the finite number of the defined sets of signals.

13. The peripheral device of claim 12, wherein the peripheral device is a nonvolatile memory device.

14. The peripheral device of claim 13, wherein the nonvolatile memory device is a flash memory card.

15. The peripheral device of claim 12, wherein the operating modes are selected from the group consisting of USB, PCMCIA, and ATA IDE.

16. The peripheral device of claim 12, wherein the controller is further configured to configure the peripheral to operate in a defined operating mode without selectively applying and comparing signals for any of the defined sets of signals if a defined condition is met during power-up of the peripheral device.

17. The peripheral device of claim 16, wherein the defined operating mode is a PCMCIA mode.

18. The peripheral device of claim 12, wherein each defined set of signals of the finite number of defined sets of signals is different from other defined sets of signals of the finite number of defined sets of signals.

19. The peripheral device of claim 18, wherein each operating mode corresponding to a defined set of signals of the finite number of defined sets of signals is different from other operating modes corresponding to other defined sets of signals of the finite number of defined sets of signals.

20. A method of operating a peripheral device, comprising:
applying a defined set of signals to a plurality of input/output terminals of the peripheral device;
sensing signals at the plurality of input/output terminals after applying the defined set of signals;
comparing the sensed signals to the defined set of signals; and
configuring the peripheral device to operate in an operating mode corresponding to the defined set of signals if the sensed signals match the defined set of signals.

21. The method of claim 20, applying a defined set of signals to a plurality of input/output terminals of the peripheral device comprises applying the defined set of signals to a plurality of input/output terminals of a nonvolatile memory device.

22. The method of claim 21, wherein applying the defined set of signals to a plurality of input/output terminals of a nonvolatile memory device comprises applying the defined set of signals to a plurality of input/output terminals of a flash memory card.

23. The method of claim 20, further comprising:
if a power-up condition is met, configuring the peripheral device to operate in a defined operating mode; and
if the power-up condition is not met, proceeding to apply the defined set of signals.

24. The method of claim 20, further comprising:
configuring the peripheral device to operate in a defined operating mode different from the operating mode corresponding to the defined set of signals if there is a discrepancy between the sensed signals and the defined set of signals.

25. The method of claim 20, further comprising:
if there is a discrepancy between the sensed signals and the defined set of signals, applying a different defined set of signals to the plurality of input/output terminals of the peripheral device; and
sensing signals at the plurality of input/output terminals after applying the different defined set of signals;
comparing the sensed signals to the different defined set of signals; and
configuring the peripheral device to operate in an operating mode corresponding to the different defined set of signals if the sensed signals match the different defined set of signals.

26. The method of claim 20, wherein applying a defined set of signals to a plurality of input/output terminals of the peripheral device comprises applying the defined set of signals to input/output terminals of the peripheral device that are inactive for the operating mode corresponding to the defined set of signals.

27. A method of operating a peripheral device, comprising:
applying a particular one of a defined set of signals of a finite number of defined sets of signals to a plurality of input/output terminals of the peripheral device;
sensing signals at the plurality of input/output terminals after applying that particular defined set of signals;
comparing the sensed signals to that particular defined set of signals;
if the sensed signals match that particular defined set of signals, configuring the peripheral device to operate in an operating mode corresponding to that particular defined set of signals; and
if the sensed signals do not match that particular defined set of signals, configuring the peripheral device to operate in an operating mode not corresponding to any of the finite number of defined sets of signals if that particular defined set of signals is a last defined set of signals of the finite number of the defined sets of signals, and repeating selectively applying and comparing signals for a next defined set of signals if that particular defined set of signals is not the last defined set of signals of the finite number of the defined sets of signals.

28. The method of claim 27, wherein applying a particular one of a defined set of signals of a finite number of defined sets of signals to a plurality of input/output terminals of the peripheral device comprises applying the particular defined set of signals to a plurality of input/output terminals of a nonvolatile memory device.

29. The method of claim 28, wherein applying the particular defined set of signals to a plurality of input/output terminals of a nonvolatile memory device comprises applying the particular defined set of signals to a plurality of input/output terminals of a flash memory card.

30. The method of claim 27, further comprising:
checking whether a defined condition is met during power-up of the peripheral device;
configuring the peripheral to operate in a defined operating mode without selectively applying and comparing signals for any of the defined sets of signals if the defined condition is met.

* * * * *